(12) United States Patent
Mohan

(10) Patent No.: US 7,333,521 B1
(45) Date of Patent: Feb. 19, 2008

(54) METHOD OF SENSING VCSEL LIGHT OUTPUT POWER BY MONITORING ELECTRICAL CHARACTERISTICS OF THE VCSEL

(75) Inventor: Jitendra Mohan, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 209 days.

(21) Appl. No.: 10/728,120

(22) Filed: Dec. 4, 2003

(51) Int. Cl.
*H01S 3/13* (2006.01)
*H01S 3/00* (2006.01)
*H01S 5/00* (2006.01)

(52) U.S. Cl. ............... 372/29.02; 372/29.021; 372/38.02; 372/50.124

(58) Field of Classification Search ............. 372/38.01, 372/38.02, 38.08, 29.02, 29.021, 50.124
See application file for complete search history.

(56) References Cited

U.S. PATENT DOCUMENTS

| 5,414,280 | A  | * | 5/1995  | Girmay ................... 257/80 |
|-----------|----|---|---------|----------------------------------|
| 5,859,658 | A  | * | 1/1999  | Hammond ................. 347/238 |
| 6,355,905 | B1 | * | 3/2002  | Sasaki et al. ........... 219/121.62 |
| 6,356,774 | B1 | * | 3/2002  | Bernstein et al. ........... 600/323 |
| 6,359,330 | B1 | * | 3/2002  | Goudard ................. 257/678 |
| 6,441,558 | B1 | * | 8/2002  | Muthu et al. ............. 315/149 |
| 6,760,124 | B1 | * | 7/2004  | Boerger et al. ............ 358/1.9 |
| 6,807,202 | B1 | * | 10/2004 | Plamper et al. .......... 372/29.02 |
| 6,853,657 | B2 | * | 2/2005  | Althaus et al. .......... 372/38.02 |
| 6,890,097 | B2 | * | 5/2005  | Tanaka .................. 374/185 |
| 7,023,543 | B2 | * | 4/2006  | Cunningham ............. 356/300 |
| 2003/0035259 | A1 | * | 2/2003 | Mauder et al. ............ 361/93.1 |
| 2003/0057888 | A1 | * | 3/2003 | Archenhold et al. ........ 315/291 |
| 2005/0111797 | A1 | * | 5/2005 | Sherrer et al. .............. 385/93 |
| 2005/0249252 | A1 | * | 11/2005 | Sanchez ................ 372/38.07 |

* cited by examiner

*Primary Examiner*—Minsun Oh Harvey
*Assistant Examiner*—Phillip Nguyen

(57) ABSTRACT

Output power of light emitted from a data transmission light source is determined based upon forward voltage, forward current, ambient temperature and a factor specific to the manner in which the light source is mounted. Output power is determined with sufficient accuracy to control operation of the data transmission light source for compliance with eye safety and transmission protocol requirements without use of a complex lens and monitor diode.

20 Claims, 1 Drawing Sheet

METHOD OF SENSING VCSEL LIGHT OUTPUT POWER BY MONITORING ELECTRICAL CHARACTERISTICS OF THE VCSEL

TECHNICAL FIELD OF THE INVENTION

The present invention is directed, in general, to control of data transmission optical sources and, more specifically, to power control over optical sources without use of a monitor diode.

BACKGROUND OF THE INVENTION

Data transmission over an optical medium such as an optical fiber typically requires use of a laser classified by the limit imposed on output power (and the corresponding danger associated with use of such output power), with many systems employing, for instance, a Class 2 laser. Accordingly, the output power of lasers employed must satisfy stringent eye safety requirements and equally stringent requirements defined by the transmission protocol (e.g., Ethernet, fiber channel, etc.).

Conventional optical power control schemes employ a p-type/intrinsic/n-type (PIN) semiconductor light detection monitor diode and a partially reflective lens to monitor the output of a vertical cavity surface emitting laser (VCSEL) or other light source. A small fraction of the light emitted by the laser is reflected to the PIN diode, which converts the light to an electrical current sensed by a transimpedance amplifier for conversion into a voltage. The voltage representative of the reflected light is compared against a reference voltage and an error signal generated on the basis of that comparison is employed to servo the VCSEL light output power to desired level.

Use of a complex lens to partially reflect transmitted light onto a monitor diode employed to control output power introduces mechanical and optical design complexities and assembly complexity, and increases costs. In addition, detailed knowledge of the package design and/or VCSEL characteristics is typically required.

There is, therefore, a need in the art for a system and technique for monitoring output power from a data transmission light source without requiring use of a monitor diode.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

To address the above-discussed deficiencies of the prior art, it is a primary object of the present invention to provide, for use in an optical subassembly for network transmission of data over an optical fiber from a computer, determination of output power of light emitted from a data transmission light source based upon forward voltage, forward current, ambient temperature and a factor specific to the manner in which the light source is mounted. Output power is determined with sufficient accuracy to control operation of the data transmission light source for compliance with eye safety and transmission protocol requirements without use of a complex lens and monitor diode.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art will appreciate that they may readily use the conception and the specific embodiment disclosed as a basis for modifying or designing other structures for carrying out the same purposes of the present invention. Those skilled in the art will also realize that such equivalent constructions do not depart from the spirit and scope of the invention in its broadest form.

Before undertaking the detailed description below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller might be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases.

Figure 1:
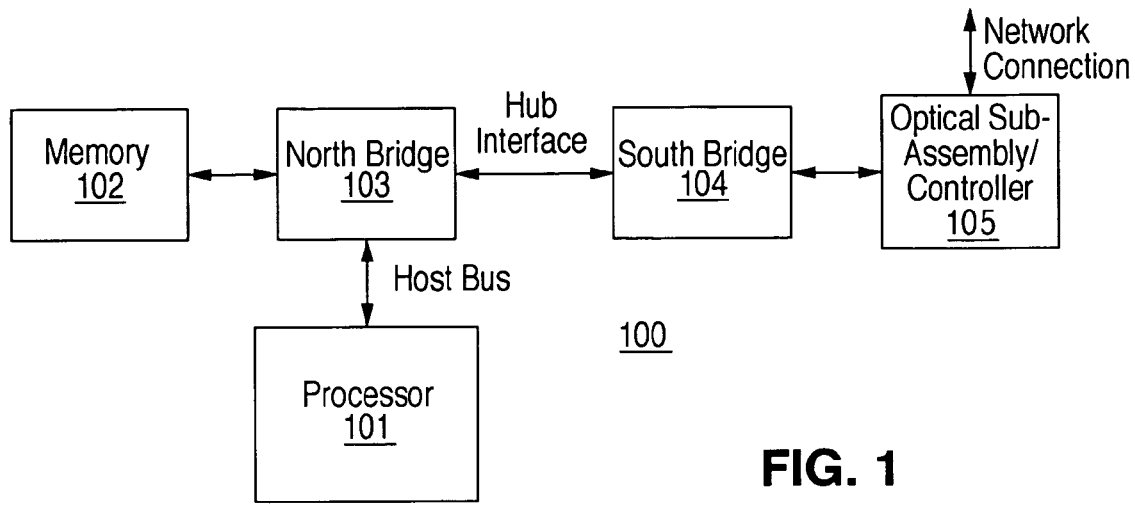
FIG. 1 depicts a computer implementing prediction and control of optical modulation amplitude and/or extinction ratio for an optical sub-assembly therein according to one embodiment of the present invention.
Figure 2:
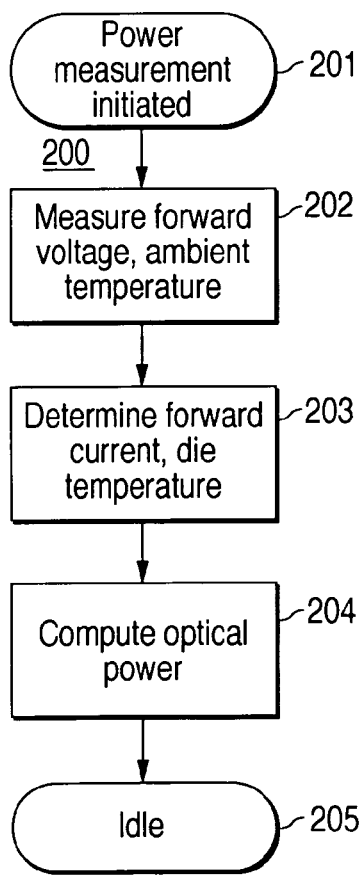
FIG. 2 is a high level flowchart illustrating a process for determining average power without utilizing feedback from an optical monitor according to one embodiment of the present invention.

FIGS. 1 through 2, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged device.

FIG. 1 depicts a computer implementing prediction and control of optical modulation amplitude and/or extinction ratio for an optical sub-assembly therein according to one embodiment of the present invention. Those skilled in the art will recognize that the full construction and operation of a mobile computer is not depicted and described. Instead, for simplicity and clarity, only so much of a mobile computer as is unique to the present invention or necessary for an understanding of the present invention is depicted or described.

Computer 100 includes a processor 101, main memory 102, and bridges 103 and 104 enabling the processor 101 to interface with other system elements. Processor 101 employs a memory controller host or "north bridge" 103 to interface with main memory 102 and graphics units (not shown). Processor 101 employs an interface controller host or "south bridge" 104, coupled to the north bridge 103 by a hub interface, to interface with other devices over standard, general-purpose buses such as a Peripheral Component Interconnect (PCI) bus.

In the present invention, south bridge 104 is coupled (using, for instance, a card mounted within a PCI bus slot) to an optical sub-assembly (OSA) 105 including an optical transceiver and a controller (not shown) providing a network connection over an optical medium, such as an Ethernet network connection over optical fiber(s). Optical transmission power for optical sub-assembly 105 is based on optical modulation amplitude or extinction ratio and average power in the manner described in further detail below.

In describing the scheme for control over extinction ratio according to the present invention, the following values are employed: $P_o$ represents the instantaneous VCSEL output power; $P_{avg}$ represents the time-averaged (low pass filtered) value of output power $P_o$; I represents VCSEL current; $I_1$ represents logical "1" ("on") level current and $I_0$ represents logical "0" ("off") level current, which typically is not zero; $I_{avg}$ represents average VCSEL current calculated from $I_{avg}=(I_1+I_0)/2$; $I_{th}$ represents threshold current; $I_{mod}$ represents modulation current calculated from $I_{mod}=I_1-I_0$; η represents slope efficiency; ER=10 log($P_1/P_0$) represents extinction ratio; OMA=($P_1-P_0$) represents optical modulation amplitude, more commonly employed in current control systems than ER; and $T_n$ denotes sampling time.

The power output of a VCSEL is given by:

$$P_o=(I-I_{th})\cdot\eta, \text{ and}$$

$$P_{avg}=(I_{avg}-I_{th})\cdot\eta.$$

The present invention relates to prediction of average power. Other means may be employed to control extinction ratio based on average power values determined according to the present invention.

FIG. 2 is a high level flowchart illustrating a process for determining average power without utilizing feedback from an optical monitor according to one embodiment of the present invention. As noted above, the VCSEL light output power may be monitored directly utilizing a lens and PIN diode. Alternatively, however, the average power measurement $P_{avg}(N)$ required for estimating and controlling optical modulation amplitude or extinction ratio as described above may be determined based on conservation of power and temperature measurements.

While a temperature sensor such as a diode, a thermocouple, or the like may be integrally formed with the VCSEL for use in measuring the die temperature, the forward voltage $V_f$ of a VCSEL has a well-known dependence on temperature. Accordingly, the die temperature for the VCSEL may be determined by monitoring the forward voltage $V_f$, which is commonly already measured. The die temperature is also dependent on total power dissipated in the VCSEL and the temperature coefficient of the optical sub-assembly (OSA), such that VCSEL light power may be expressed as:

$$\text{Power(optical)} = P(\text{electrical}) - \frac{T(VCSEL) - T(\text{ambient})}{\theta_{ja}},$$

where T(VCSEL) is a function of the VCSEL forward voltage, T(ambient) is the ambient temperature surrounding the VCSEL integrated circuit, measured by a temperature sensor, and $\theta_{ja}$ (where "ja" represents junction-to-ambient, as opposed to junction-to-case and case-to-ambient) is a value specific to the manner in which the VCSEL is mounted and may be determined for a specific design and fabrication process.

The expression above for power may be rewritten as:

$$\text{Power(optical)} = V_f(VCSEL) \times I_f(VCSEL) - \frac{T(V_f(VCSEL)) - T(\text{ambient})}{\theta_{ja}}$$

The forward current $I_f$, which for most VCSELs have a small and predictable variation dependent on forward voltage/temperature, may be measured using a series resistance, calculated, or determined. Similarly, the temperature T(VCSEL) may be calculated or determined from a lookup table based on the forward voltage.

Accordingly, in one embodiment of the present invention illustrated by process 200, whenever an output power measurement is initiated (step 201), the forward voltage $V_f$ of the VCSEL and ambient temperature T(ambient) around the VCSEL are measured (step 202). The forward current $I_f$ and die temperature T(VCSEL) are determined from the measured forward voltage (step 203), either by calculation or using a look-up as described above. The optical power is then calculated (step 204), and the process becomes idle until another power measurement is required (step 205).

The embodiment of FIG. 2 avoids the need for a complex lens to reflect part of the transmitted light onto a monitor diode used to control the average power of the transmitted light, reducing mechanical and optical design complexity, assembly process complexity, and cost. Potentially more accurate power information is available, without the necessity for detailed knowledge of the packed design or VCSEL characteristics.

The present invention allows precise control over average power output for a light source in a data transmission system based on power measurements. Other methods may be employed for estimating and controlling either extinction ratio or optical modulation amplitude using data obtained from average power values. In one embodiment, the power parameters required for such control may be derived from temperature and forward voltage measurements.

It is important to note that while the present invention has been described in the context of a fully functional system, those skilled in the art will appreciate that at least portions or aspects of the mechanism of the present invention are capable of being distributed in the form of a machine usable medium containing instructions in a variety of forms, and that the present invention applies equally regardless of the particular type of signal bearing medium utilized to actually carry out the distribution. Examples of machine usable mediums include: nonvolatile, hard-coded type mediums such as read only memories (ROMs) or erasable, electrically programmable read only memories (EEPROMs), recordable type mediums such as floppy disks, hard disk drives and compact disc read only memories (CD-ROMs) or digital versatile discs (DVDs), and transmission type mediums such as digital and analog communication links.

Although the present invention has been described in detail, those skilled in the art will understand that various changes, substitutions, variations, enhancements, nuances, gradations, lesser forms, alterations, revisions, improvements and knock-offs of the invention disclosed herein may be made without departing from the spirit and scope of the invention in its broadest form.

The invention claimed is:

1. A system comprising:
 a controller that, when operably coupled to a light source emitting light at a selectively variable output power,
 measures the forward voltage across the light source,
 measures an ambient temperature around the light source,
 determines a forward current through the light source based on the measured forward voltage,
 determines a die temperature of the light source from the measured forward voltage, and
 determines an output power for emitted light based upon the forward voltage across the light source, the forward current through the light source, the ambient temperature around the light source, and the die temperature of the light source.

2. The system according to claim 1, wherein a conversion factor that is specific to a manner in which the light source is mounted converts a difference between the die temperature and the ambient temperature to a value of power.

3. The system according to claim 1, wherein the forward current is calculated or determined from a look-up table.

4. The system according to claim 1, wherein the controller determines the output power for emitted light without using a plurality of values of forward current through the light source.

5. The system according to claim 1, wherein the die temperature is calculated or determined from a look-up table.

6. The system according to claim 1, wherein the output power is determined without measurement of emitted light.

7. An optical subassembly including the system according to claim 1, the optical subassembly further comprising the light source and adapted for transmission of data over an optical transmission medium.

8. A computer including the optical subassembly according to claim 7, the computer further comprising:
 a processor coupled to the controller; and
 a network connection through the optical subassembly to the optical transmission medium.

9. A method comprising:
 employing a forward voltage measured across a light source to determine a forward current through the light source; and
 determining an output power for light emitted from the light source emitting light at a selectively variable output power, wherein the determination of the output power is based upon the forward voltage and current across the light source, the forward current through the light source, an ambient temperature around the light source, and a die temperature of the light source.

10. The method according to claim 9, further comprising: converting a difference between the die temperature and the ambient temperature to a value of power using a conversion factor that is specific to a manner in which the light source is mounted.

11. The method according to claim 9, further comprising:
 measuring the forward current;
 calculating the forward current; or
 determining the forward current from a look-up table.

12. The method according to claim 9, further comprising:
 determining the output power for the emitted light without using a plurality of values of forward current through the light source.

13. The method according to claim 9, further comprising:
 calculating the die temperature; or
 determining the die temperature from a look-up table.

14. The method according to claim 9, further comprising:
 determining the output power without measurement of emitted light.

15. An optical subassembly comprising:
 a light source emitting light at a selectively variable output power; and
 a controller that, when operably coupled to the light source,
 measures the forward voltage across the light source,
 measures an ambient temperature around the light source,
 determines a forward current through the light source based on the measured forward voltage,
 determines a die temperature of the light source from the measured forward voltage, and
 determines an output power for emitted light based upon the forward voltage across the light source, the forward current through the light source, the ambient temperature around the light source, and the die temperature of the light source.

16. The optical subassembly according to claim 15, further comprising:
 a temperature sensor proximate to the light source and coupled to the controller, the temperature sensor providing measurements of the ambient temperature for use by the controller.

17. The optical subassembly according to claim 16, wherein the controller further comprises:
 a voltage detector providing measurements of the forward voltage to the controller.

18. The optical subassembly according to claim 15, wherein the controller applies a conversion factor that is specific to a manner in which the light source is mounted to convert a difference between the die temperature and the ambient temperature to a value of power.

19. The optical subassembly according to claim 15, further comprising:
 a memory communicably coupled to the controller, the memory containing one or both of a look-up table for the forward current and a look-up table for the die temperature.

20. The optical subassembly according to claim 15, wherein the output power is determined without measurement of emitted light emitted by the light source.

* * * * *

UNITED STATES PATENT AND TRADEMARK OFFICE
CERTIFICATE OF CORRECTION

| | | |
|---|---|---|
| PATENT NO. | : 7,333,521 B1 | Page 1 of 1 |
| APPLICATION NO. | : 10/728120 | |
| DATED | : February 19, 2008 | |
| INVENTOR(S) | : Jitendra Mohan | |

It is certified that error appears in the above-identified patent and that said Letters Patent is hereby corrected as shown below:

Column 5, claim 9, line 49, delete "and current".

Signed and Sealed this

Twenty-sixth Day of August, 2008

JON W. DUDAS
*Director of the United States Patent and Trademark Office*